United States Patent [19]

Ishibashi et al.

[11] Patent Number: 4,835,579
[45] Date of Patent: May 30, 1989

[54] SEMICONDUCTOR APPARATUS

[75] Inventors: Akira Ishibashi, Kanagawa; Yoshifumi Mori, Chiba; Masao Itabashi, Kanagawa, all of Japan

[73] Assignee: Sony Corporation, Tokyo, Japan

[21] Appl. No.: 839,712

[22] Filed: Mar. 13, 1986

[30] Foreign Application Priority Data

Mar. 15, 1985 [JP] Japan .................................. 60-52973

[51] Int. Cl.$^4$ ........................................... H01G 27/12
[52] U.S. Cl. ........................................ 357/4; 357/16
[58] Field of Search ..................................... 357/16, 4

[56] References Cited

U.S. PATENT DOCUMENTS 3,893,044 7/1975 Dumke et al. .
4,122,407 10/1978 Van Vechten .
4,511,408 4/1985 Holonyak, Jr. .
4,599,728 7/1986 Alavi ............................ 357/16 X

OTHER PUBLICATIONS

Solid-State Superlattices, by Gottfried H. Döhler, Scientific American, Nov. 1983 issue, pp. 118-126.

Primary Examiner—Martin H. Edlow
Attorney, Agent, or Firm—Philip M. Shaw, Jr.

[57] ABSTRACT

A semiconductor apparatus is disclosed, in which the entire or part of an electron active region is formed by a superlattice structure semiconductor layer in which a plurality of different semiconductor layers, less than 8 monolayers, and containing a fraction or a binary compound semiconductor layers are alternately and epitaxially grown and a main current direction is selected to be in the direction perpendicular to the laminae of said superlattice layers.

9 Claims, 7 Drawing Sheets

FIG. 1

FIG. 2 n: Number of Monolayers Per Slab

Wave Function of Phonon in $(AlAs)_1 (GaAs)_2$

SEMICONDUCTOR APPARATUS

BACKGROUND OF THE INVENTION

1. Field of the Invention

The present invention relates to a semiconductor, heterostructure superlattice structure suitable for use in various kinds of semiconductor devices such as a field effect transistor (FET), a hot electron transistor (HET), a heterojunction type bipolar transistor (HBT) and so on.

2. Description of the Prior Art

To make various kinds of semiconductor devices, such as an FET, an HET, an HBT and the like, operable at high speeds, it is desirable that the electron mobility in such devices be as high as possible. In order to enhance the electron mobility, there is known in the art a method for increasing the purity of a semiconductor layer in an electron active region. According to this method a two-dimensional electron gas layer is used to avoid impurity scattering.

Although it is desirable to enhance the electron mobility even more, and various methods have been proposed to realize this purpose, the electron mobility near or at room temperature is determined in practice by the electron scattering caused by longitudinal optical (LO) phonons within the structure. Therefore, there is a problem that prevents realization of an adequately high electron mobility.

OBJECT AND SUMMARY OF THE INVENTION

An object of the present invention is to provide a high speed semiconductor apparatus.

It is another object of the invention to provide a semiconductor device in which electron longitudinal optical phonon interaction is substantially reduced or absent.

It is yet a further object of the invention to provide an electron-transport-device which will have a large electron mobility at room temperature.

It is still another object of the present invention to obtain high electron mobility in a superlattice semiconductor device by preventing electron scattering due to LO phonons.

The foregoing and other objects are achieved by this invention which is a semiconductor heterostructure superlattice in which a plurality of different thin semiconductors of less than 8 monolayers or binary compound semiconductor layers are repeatedly laminated, preferably with each semiconductor layer being made about a single atom thick and in which a main electron active direction is selected to be in the laminated layer direction. The resulting structure has the special property of a de-localized state of the electron and a localized state of the LO phonon (longitudinal optical phonon) with respect to the laminated layer direction in each semiconductor layer which allows the electron mobility to be modulated by the mutual action therebetween.

These and other objects, features and advantages of the present invention will become apparent from the following detailed description of the preferred embodiment taken in conjunction with the accompanying drawings.

DESCRIPTION OF THE PREFERRED EMBODIMENT

The present invention resides in a semiconductor heterostructure superlattice having a periodic structure in which a plurality of different semiconductor layers are repeatedly laminated and is based on the discovery that when the semiconductor layer is formed as a ultrathin layer, i.e., a thin layer having a periodicity (thickness) less than 8 monolayers, it exhibits a property which is different from Kronig-Penney electron model. The electrons are delocalized and LO phonons can be localized to the layers.

Figure 1:
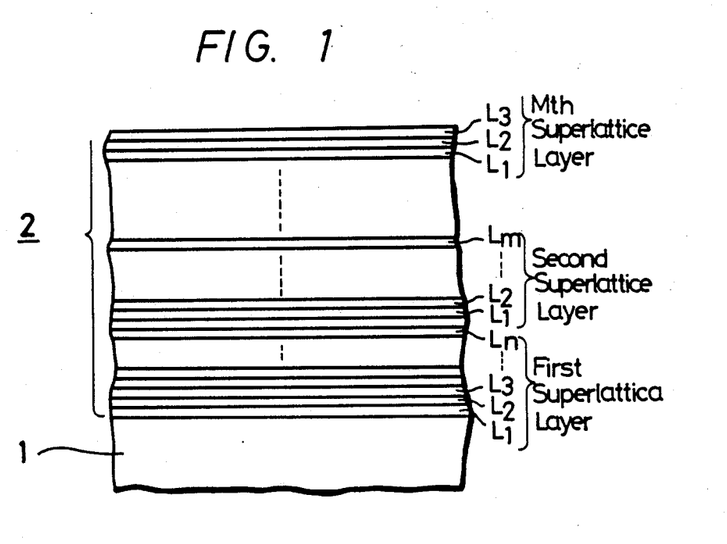
FIG. 1 is a schematic cross-sectional view of the superlattice structure of a semiconductor apparatus.

Specifically, according to the present invention, as shown in FIG. 1, on substrate 1, there is formed a semiconductor layer 2 having a superlattice structure comprised of a plurality of semiconductor monolayers $L_1, L_2, L_3, \ldots L_n$, less than eight, each containing a fraction or binary compound first semiconductor. These layers are alternately and repeatedly laminated with a plurality of semiconductor monolayers $L_1, L_2, L_3 \ldots L_m$, less than eight, each containing a fraction or binary compound second semiconductor which is different from the first semiconductor. All the layers are epitaxially grown at atmospheric pressure by the MOCVD (Metal Organic Chemical Vapour Deposition) method or MBE (Molecular Beam Epitaxy) method and constitute the whole or part of electron active region of the device. Thus in such a semiconductor apparatus the main electron active region direction crosses these semiconductor substance layers $L_1, L_2, L_3, \ldots$ In a preferred embodiment, the semiconductor layer 2 is made of a superlattice with a unit lattice period of $(AlAs)_m (GaAs)_n$, with m and n less than 8, and which is formed on a Cr doped (100) GaAs semi-insulating substrate 1 by alternatively forming m and n monolayers per slab of two kinds of compound semiconductors AlAs and GaAs, to have an entire thickness of between 1300 to 2500Å at a substrate temperature of 720° to 750° C., by switchably supplying arsine ($AsH_3$), trimethylaluminum (TMA) and trimethylgallium (TMG) gas as source materials in a sequencer controlled MOCVD process under atmospheric pressure. A growth rate less than 1 Å/sec., and for superlattice fabrications, a rate as low as 0.63 Å/sec. for both AlAs and GaAs can be used, for example. See, H. Kawai, K. Kaneko, N. Watanabe: *J. Appl. Phys.* 56 (1984) 463, for example.

Energy gaps in the superlattice structure were measured when n was changed, under the condition that m=n. The results are plotted as black circles in FIG. 2.

Figure 2:
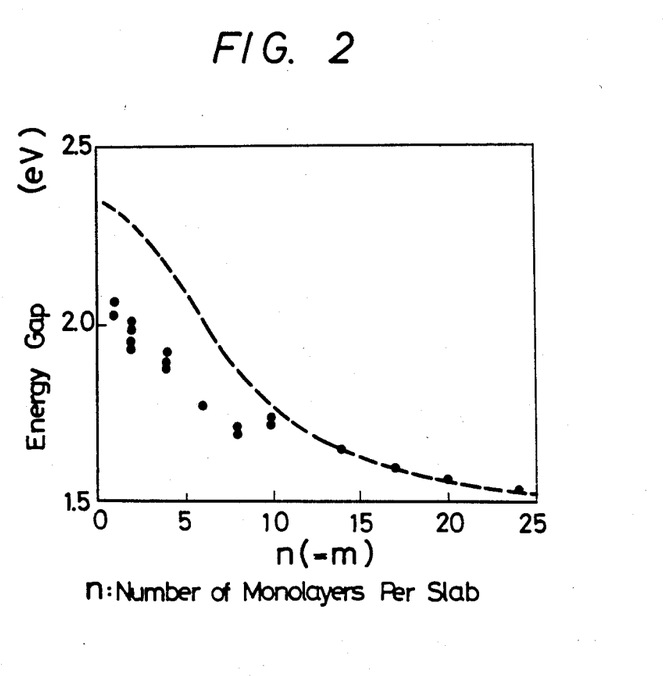
FIG. 2 is a graph of measured results of the relationship between the number of monolayers per slab and the energy gap.

In FIG. 2, a broken line curve indicates the energy gaps that are provided by the calculation based on the Kronig-Penney electron model theory. As will be clear from the comparison, when n<8, they do not coincide with those in the Kronig-Penney electron model. The reason for this is that when n (=m)≦8, the electron is not localized any more and the electron can be conducted in the laminated direction of the layer without the tunnel effect.

Figure 3:
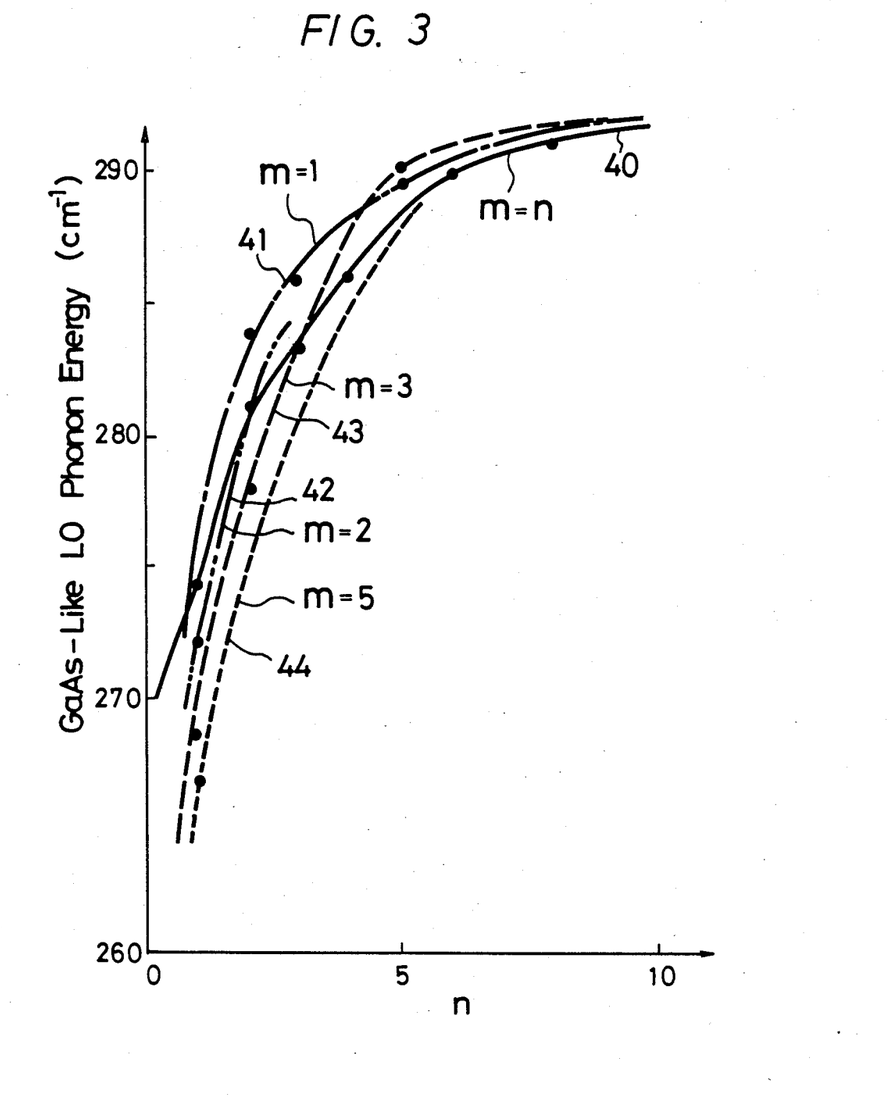
FIG. 3 to 6 are respectively graphs of measured results of the number of monolayers per slab and LO phonon energies used to explain the present invention.

A further interesting characteristic in relation to the above mentioned semiconductor layer formed of (AlAs)m (GaAs)n was found when a Raman scattering experiment was carried out. The measurement was carried out by using an excitation light having a wavelength of 514.5 nm and Raman light scattered to the backward was measured by a double-monochromatic spectrometer at room temperature. FIG. 3 shows the measured results of the dependence of GaAs-like LO phonon energy in the (AlAs)m (GaAs)n on n (the number of monolayers per slab). In FIG. 3, a curve 40 indicates the case where m=n and curves 41 to 44 indicate the cases where m=1, m=2, m=3 and m=5 monolayers per slab, respectively. According to the graph, the GaAs-like LO phonon energy is determined not by the value of m but by the value of n, that is, the GaAs monolayer.

Figure 4:
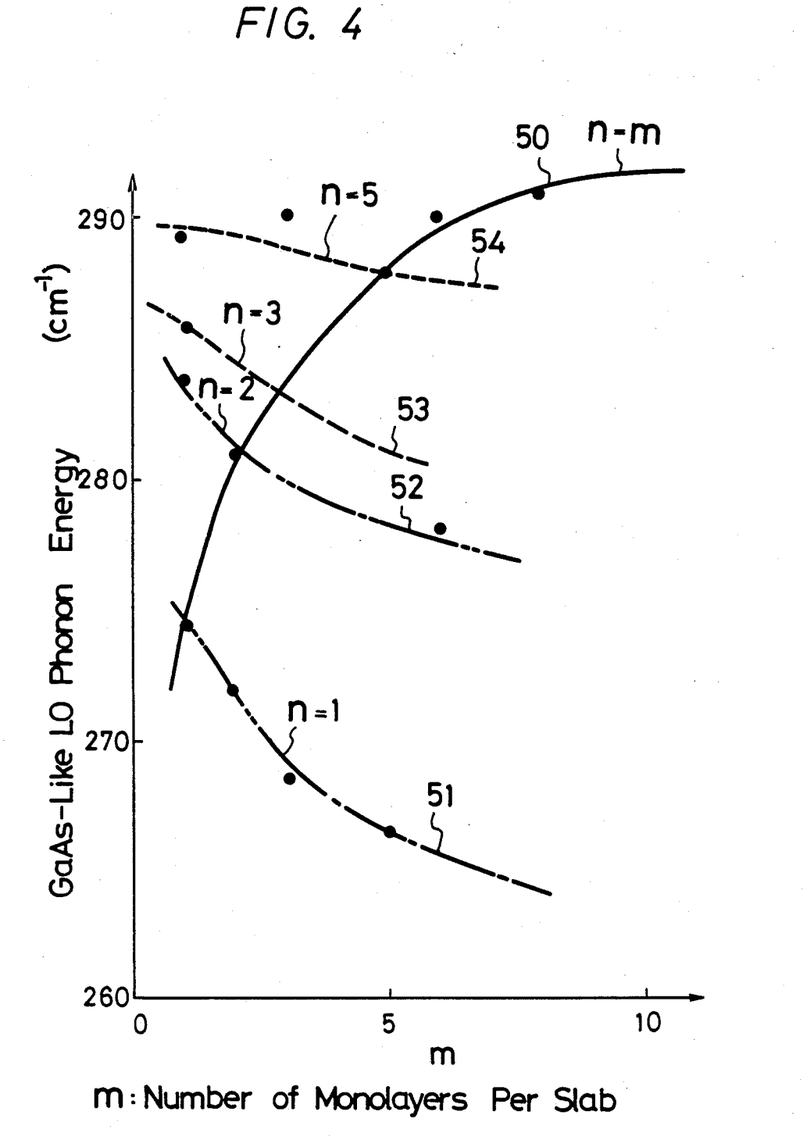

FIG. 4 shows measured results of the dependence of the GaAs-like LO phonon on the value m (the number of monolayers per slab). In FIG. 4, a curve 50 indicates the case where value m is varied when m=n. Curves 51 to 54 indicate the cases where n=1, n=2, n=3 and n=5 monolayers per slab, respectively. According to the graph, as will be clear from the comparison of the respective curves 51 to 54 each taking n as a parameter, although the GaAs-like LO phonon energy is varied considerably as n is varied, the respective curves 51 to 54 present gentle inclinations. In other words, they have small dependence on the value m.

Figure 5:
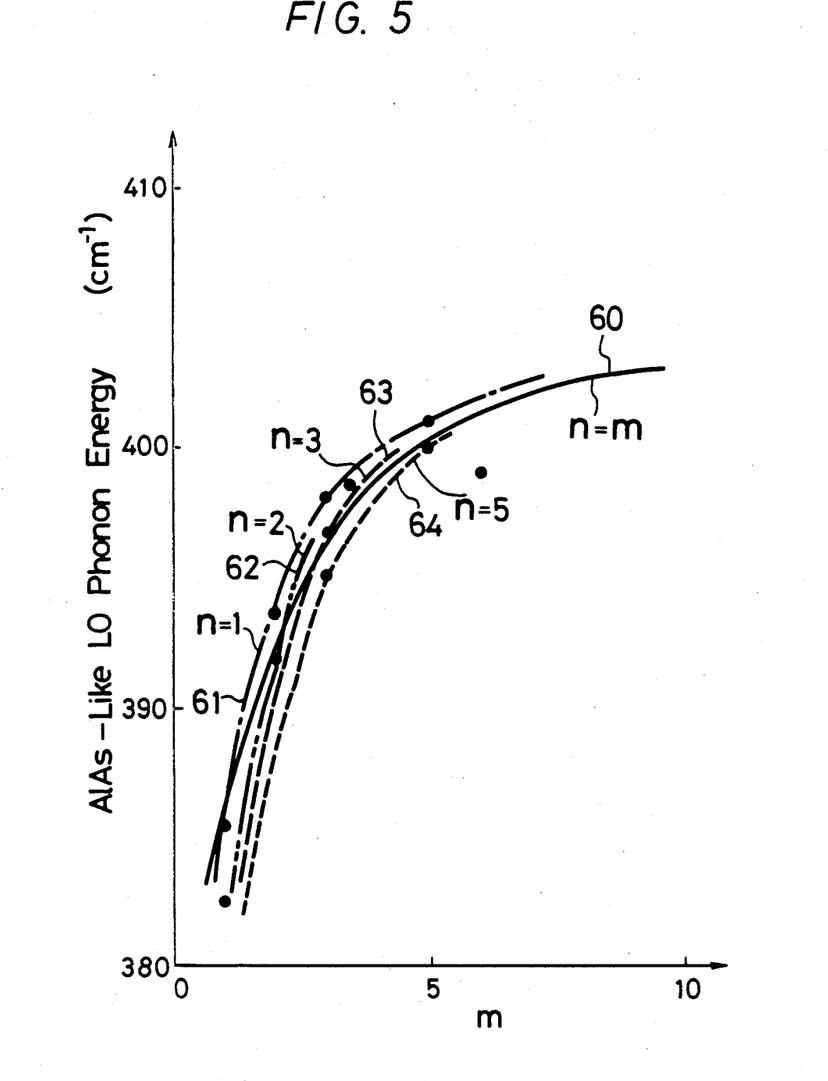

FIG. 5 shows measured results of the dependence of AlAs-like LO phonons energy in the (AlAs)m (GaAs)n on m the number of monolayers per slab). In FIG. 5, a curve 60 indicates the case where m=n and curves 61 to 64 indicate the cases where n=1, n=2, n=3 and n=5 monolayers per slab, respectively. According to the graph, the energy of the AlAs-like LO phonon is determined by not the value n but the value m, that is, the number of AlAs monolayers per slab.

Figure 6:
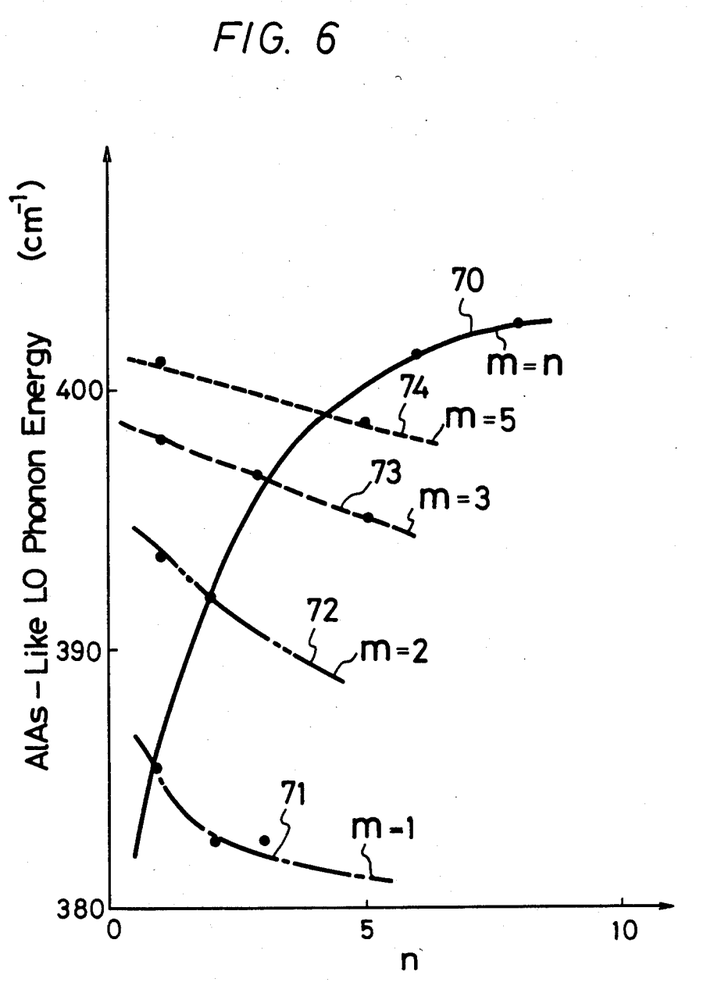

FIG. 6 shows measured results of the dependence of AlAs-like LO phonon on the value n (the number of monolayers per slab). In FIG. 6, a curve 70 indicates a case where the value n is varied when m=n, and curves 71 to 74 indicate measured results in the cases where m=1, m=2, m=3 and m=5 monolayers per slab, respectively. Accordingly, as will be clear from the comparison of the respective curves 71 to 74 each having m as a parameter, although the AlAs-like LO phonon energy is varied significantly as the value m is varied, the respective curves 71 to 74 present gentle inclinations. In other words, they have small dependence on the value n (the number of monolayers per slab of GaAs).

In summary, as illustrated by the curves in FIGS. 3 to 6, the GaAs-like phonon energy is not dependent on the number m of the AlAs monolayers but is determined by the number n of the GaAs monolayers, while the AlAs-like phonon energy is not dependent by the number m of the AlAs monolayers. In other words, the LO phonons are localized in the GaAs layer and the AlAs layer, respectively.

Figure 7:
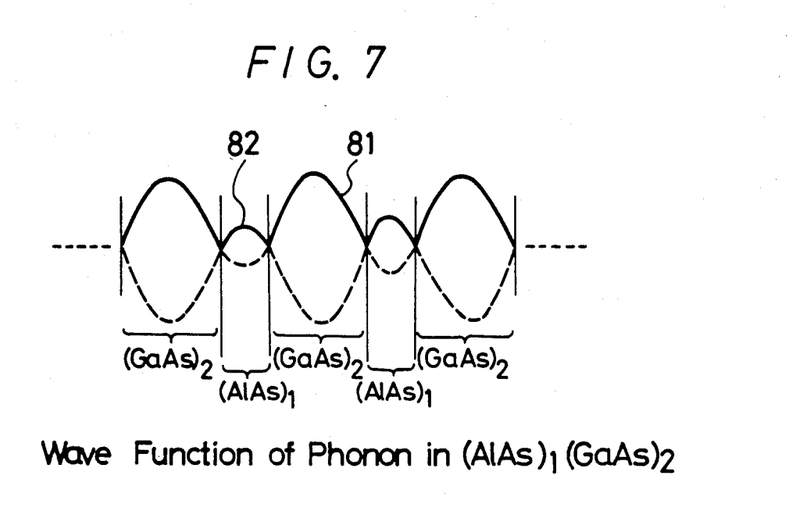
FIG. 7 is a diagram showing a wave function of a phonon in the superlattice structure portion.

This is illustrated in FIG. 7 which shows respective wave functions of the GaAs-like phonon and AlAs-like phonon in (AlAs)$_1$ (GaAs)$_2$. They are standing waves which are localized in the GaAs layers and the AlAs layers as shown by curves 81 and 82, respectively. More specifically, the GaAs-like phonon and the AlAs-like phonon are respectively localized and the kinetic momenta thereof are modulated by the values n and m, respectively.

According to the present invention as mentioned above, the LO phonon is thus localized by the superlattice structure having less than 8 monolayers and the kinetic momentum thereof is modulated. Accordingly, the scattering probability concerning the electron is also modulated, whereby it is possible to realize a high speed semiconductor device because electron-LO phonon interactions are substantially reduced or eliminated.

This can be explained as follows. The LO phonon-electron scattering probability W can be expressed by using LO phonon-electron scattering matrix element $M_{LO\text{-}e}$ and phase space (f) as follows.

$$W=(2\pi/\hbar)\rho(f) \, |M_{LO\text{-}e}|^2 \, \delta(Ef-Ei) \quad (1)$$

($\hbar$=h/2 and h is the Planck's constant) $M_{LO\text{-}e}$ is proportionate to the reciprocal number of momentum. However, as described above, since the phonon wave function is a standing wave, the momentum that the phonon can take in the final state is considerably restricted. Therefore $M_{LO\text{-}e}$ in the aforesaid superlattice is smaller than that in bulk. Accordingly, the scattering probability of the electrons by the LO phonons becomes very small and the modulation of the electron mobility occurs.

Figure 8:
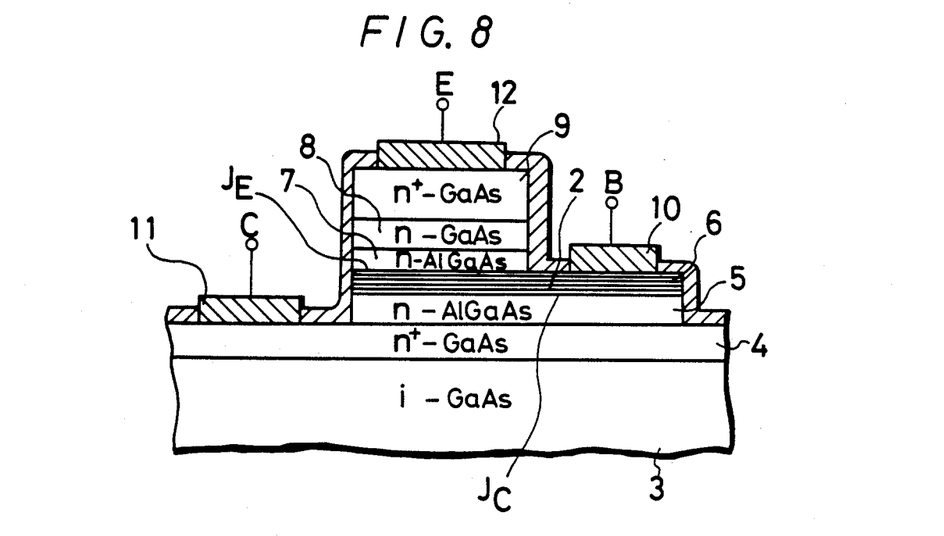
FIG. 8 is a schematically enlarged cross-sectional view of an embodiment of a semiconductor apparatus incorporating the present invention.

The present invention will now be described more fully with reference to FIG. 8, in which the present invention is applied to a heterojunction type bipolar transistor (HBT). In the illustrative example, an npn-type HBT is formed. In this case, for example, on a GaAs substrate 3 of a semi-insulating property, there is epitaxially grown, for example, an n-type GaAs collector layer 4, having a low resistivity ($10^{-2} \sim 10^{-3}$ Ωcm), on which is epitaxially grown a collector layer 5 of, for example, an n-type AlGaAs semiconductor layer having a large band-gap (1.7–2.3 eV̄). The layer 5 forms a collector pn junction Jc of a hetero type between it and a base layer 6 which is epitaxially grown on layer 5.

Next, on this collector layer 5, there is epitaxially grown the aforementioned base layer 6 made up of the superlattice structure semiconductor layer 2. A P-type impurity, such as Se, is doped into it. Formed on the base layer 6 is an epitaxial layer 7 made of an n type AlGaAs having a large band-gap (1.7–2.3 eV̄). On this layer, there is epitaxially grown, for example, n type GaAs semiconductor layer 8 to thereby form an emitter junction $J_E$ of a heterojunction type by the pn junction, between the emitter layer 7 and the base layer 6. Further, thereon there is epitaxially grown an emitter layer 9 made of, for example, an n-type GaAs semiconductor layer having a low resistivity ($10^{-2}$Ω- cm). These layers 4 to 9 are continuously formed by an atmospheric pressure MOCVD process as described above. Parts of the semiconductor layers 9, 8 and 7 are removed by etching to expose a part of the base layer 6 on which a base electrode 10 is deposited in ohmic contact. Further, parts of the semiconductor layers 9, 8, 7 and 6 are removed by etching to expose to the outside a part of the collector layer 4 on which a collector electrode is deposited in ohmic contact and an emitter electrode 12 is deposited on the emitter region 9 in ohmic contact.

Since the HBT having the structure thus made comprises the base layer 6 which has the above mentioned superlattice structure having less than 8 atomic layers and a longitudinal structure in which the electron active direction is selected to be perpendicular to the laminae of the superlattice structure, the electron mobility is maximized. Thus the switching speed can be increased over conventionally constructed HBTs and also the transport efficiency can be increased and it is therefore possible to obtain a transistor having a high amplification factor.

While in the above mentioned example the present invention is applied to an HBT, it will be apparent that the present invention can also be used to form various other electronic devices including the HETs and FETs.

According to the present invention as mentioned above, since the LO phonons can be localized to each layer, it is possible to carry out a modulation of the electron mobility that can not be expected in the prior art. As a result, it is possible to obtain various semiconductor apparatus having excellent characteristics which are not presented by the prior art.

Figure 9:
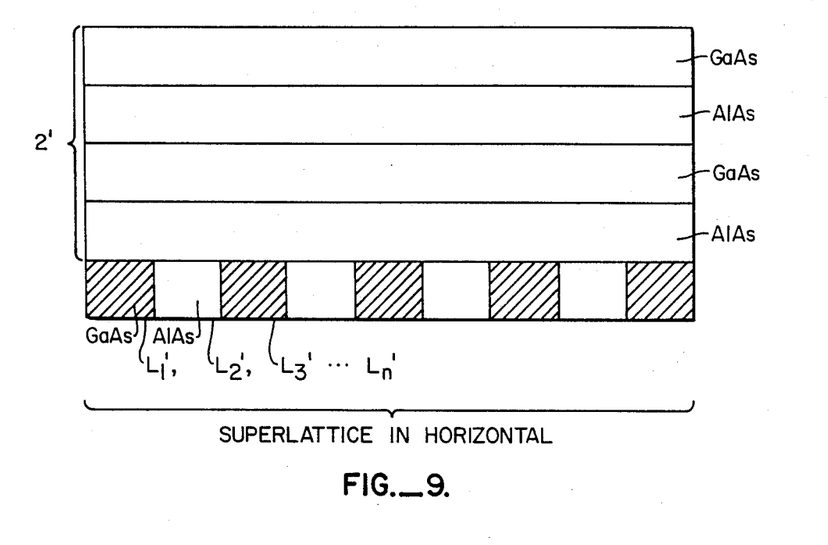
FIG. 9 is a schematic cross-sectional view of a superlattice structure according to another embodiment of the invention.

Referring now to FIG. 9 an alternative superlattice structure is shown. While usually the superlattice structure is constructed in the vertical direction, as shown in FIG. 1, it is also possible to construct the superlattice structure 2' in a horizontal direction in the plane of the monolayers. In this case, we cannot count the monolayer as an integer. For example, the number of monolayers $L_1'$, $L_2'$... is 4 4/5, i.e., an integer number of monolayers plus a fraction.

The above description is given for a single preferred embodiment of the invention but it will be apparent that many modifications and variations could be effected by one skilled in the art without departing from the spirit or scope of the novel concepts of the invention so that the scope of the invention should be determined by the appended claims only.

We claim as our invention:

1. A semiconductor apparatus comprising, in succession, a semiinsulating substrate, an N type GaAs collector layer of low resistivity which is epitaxially grown on the substrate, an epitaxially grown N type, AlGaAs collector layer having a large band-gap, an epitaxially grown superlattic structure, having been P doped, constituting a base layer and forming a pn junction with the AlGaAs collector layer, an epitaxially grown N type AlGaAs emitter layer having a large band-gap and which forms an emitter junction of the heterojunction type with the superlattic base layer, an epitaxially grown N type GaAs emitter layer, an epitaxially grown N type GaAs emitter layer of low resistivity, and means, including the semiinsulating substrate, for causing electrons to flow perpendicularly through the monolayers and further wherein the superlattice structure is formed of n monolayers of a first compound semiconductor followed by m monolayers of a second compound semiconductor followed by n monolayers of the first compound semiconductor, and so on, ending with m monolayers of the second semiconductor, where n and m are less than eight.

2. A semiconductor apparatus as recited in claim 1 wherein the means for causing electrons to flow comprises a base electrode in ohmic contact with the base layer, an emitter electrode in ohmic contact with the N type GaAs emitter layer of low resistivity and a collector electrode in ohmic contact with the N type GaAs collector layer of low resistivity.

3. A semiconductor apparatus as recited in claim 1 wherein the low resistivity collector layer has a resistivity of between $10^{-2}$ and $10^{-3}$ $\Omega$cm., the low resistivity emitter layer has a resistivity of $10^{-2}$ $\Omega$cm, and the large band gaps of the collector nd emitter layers are between 1.7–2.3 e$\overline{V}$.

4. An ultrathin semiconductor superlattice device as recited in claim 1 wherein the first and second semiconductor materials are GaAs and AlAs, respectively.

5. A semiconductor apparatus as recited in claim 1 wherein the substrate is Cr doped GaAs.

6. A semiconductor apparatus as recited in claim 1 wherein the first compound semiconductor is GaAs.

7. A semiconductor apparatus as recited in claim 1 wherein the second compound semiconductor is AlAs.

8. A semiconductor apparatus as recited in claim 1 wherein the thickness of the superlattice structure is between 1300 to 2500 Å.

9. A semiconductor apparatus as recited in claim 1 wherein m=n.

* * * * *